United States Patent
Yeon

Patent Number: 5,767,752
Date of Patent: Jun. 16, 1998

[54] FREQUENCY MODULATOR WITH CENTER FREQUENCY AND MODULATION CONTROLLED BY AN INPUT SIGNAL

[75] Inventor: Sang-Heum Yeon, Kyungki-do, Rep. of Korea

[73] Assignee: Samsung Electronics Co., Ltd., Suwon, Rep. of Korea

[21] Appl. No.: 702,352

[22] Filed: Aug. 23, 1996

[30]  Foreign Application Priority Data

Aug. 25, 1995 [KR]  Rep. of Korea ............... 95-26633

[51] Int. Cl.$^6$ ............................................. H03C 3/00
[52] U.S. Cl. ....................... 332/117; 332/135; 331/34; 331/177 R; 455/113
[58] Field of Search ...................... 332/117, 135; 331/34, 57, 113 L, 116 R, 116 FE, 117 R, 117 FE, 108 C, 144, 145, 177 R; 455/110, 113

[56]  References Cited

U.S. PATENT DOCUMENTS

| | | | |
|---|---|---|---|
| 5,105,169 | 4/1992 | Yamazaki et al. | 331/34 |
| 5,142,249 | 8/1992 | Hirotomi | 331/57 |
| 5,216,390 | 6/1993 | Erftemeijer | 331/113 R |
| 5,359,298 | 10/1994 | Abe | 331/2 |
| 5,463,353 | 10/1995 | Countryman et al. | 331/2 |

*Primary Examiner*—David Mis
*Attorney, Agent, or Firm*—Marger, Johnson, McCollom & Stolowitz, PC

[57]  ABSTRACT

A frequency modulator controls the center frequency and modulation factor at the same time with one control signal. The frequency modulator includes a voltage-to-current converter that receives an input voltage signal to be modulated, a reference voltage signal, and a control voltage signal, and generates an output current signal by combining the input voltage signal and the control voltage signal. The input voltage signal is amplified by a transconductance amplifier. The control voltage signal is converted into a gain signal which is used to vary the transconductance of the amplifier. A voltage controlled oscillator generates a frequency modulated signal responsive to the output current signal. The center frequency and modulation factor can be controlled by adjusting the value of a resistor in the current-to-voltage converter, a capacitor in the voltage control oscillator, or the control voltage signal.

18 Claims, 3 Drawing Sheets

FREQUENCY MODULATOR WITH CENTER FREQUENCY AND MODULATION CONTROLLED BY AN INPUT SIGNAL

BACKGROUND OF THE INVENTION

1. Field of the Invention

This invention relates generally to frequency modulators and more particularly to frequency modulators that can control a center frequency and degree of modulation with a control signal.

This application corresponds to Korean Patent Application No. 95-26633 filed Aug. 25, 1995 in the name of Samsung Electronics Co., Ltd., which is incorporated herein by reference.

2. Description of the Related Art

FIG. 1 is a block diagram of a prior art frequency modulator. The prior art frequency modulator includes a voltage-to-current converter 10 which receives a power supply voltage signal $V_{CC}$ and outputs a center frequency current signal $I_{fo}$ for controlling the center frequency. The frequency modulator also includes a voltage-to-current converter 11 which receives an input voltage signal $V_{in}$ to be modulated, and outputs a modulation factor control current $I_{dev}$ for controlling the degree of modulation. A voltage controlled oscillator 30 receives a control current $I_{CT}$ equal to $(I_{fo} \pm I_{dev})$ from the voltage-to-current converters 10 and 11, and outputs a frequency modulated signal.

FIG. 2 is a detailed circuit diagram of an embodiment of the prior art voltage-to-current converters 10 and 11. The circuit includes a resistor $R_{fo}$ for controlling the center frequency, and a resistor $R_{dev}$ for controlling the degree of modulation. The center frequency and the degree of modulation are adjusted by adjusting the values of the resistors $R_{fo}$ and $R_{dev}$.

FIG. 3 is a detailed circuit diagram of a well-known embodiment of the voltage controlled oscillator 30 of FIG. 1. The circuit of FIG. 3 includes an emitted coupled multivibrator. The center frequency of the voltage controlled oscillator is determined by the value of the resistors, the capacitor, and the control current $I_{CT}$.

The center frequency of the voltage controlled oscillator as a function of the control current $I_{CT}$ is governed by the following equation:

$$fo = \frac{I_{CT}}{4 \times C \times Vbe(\text{on})} \quad \text{(Eq. 1)}$$

where $I_{CT}$ is the control current, C is the capacitance, and Vbe(on) is the ON voltage of the base-emitter junction of a transistor.

The resistor $R_{fo}$ generates the center frequency current $I_{fo}$ and the resistor $R_{dev}$ generates the frequency modulation control current $I_{dev}$, as mentioned above. Since the current $I_{fo}$ and $I_{dev}$ are summed and the resultant current $I_{CT}$ controls the voltage controlled oscillator, the resistors $R_{fo}$ and $R_{dev}$ control the center frequency and modulation degree according to the following expression:

$$fo = \frac{I_{CT}}{4 \times C \times Vbe(\text{on})} = \frac{I_{fo} \pm I_{dev}}{4 \times C \times Vbe(\text{on})} = \quad \text{(Eq. 2)}$$

$$\frac{(V_{CC} - V_{ref})/R_{fo} \pm (V_{in} - V_{ref})/R_{dev}}{4 \times C \times Vbe(\text{on})}$$

where $I_{fo}$ is the center frequency current, $I_{dev}$ is the deviation control current, $R_{fo}$ is the value of a resistor coupled to a terminal for controlling the center frequency, and $R_{dev}$ the value of a resistor coupled to a terminal for controlling the degree of modulation.

The center frequency and the modulation factor must be controlled when a frequency modulator is used to receive an audio signal and modulate the frequency thereof. A disadvantage of the prior art frequency modulator is that two control terminals are required to control the center frequency and the modulation factor. Further, an additional frequency modulation detector is required to measure the magnitude of modulation during the adjustment of the modulation factor. These disadvantages increase manufacturing costs and processing time.

Accordingly, a need remains for a frequency modulator that overcomes the problems described above.

SUMMARY OF THE INVENTION

It is, therefore, an object of the present invention to control the center frequency and modulation factor of a frequency modulator with ore control terminal.

A frequency modulator according to the present invention includes a voltage-to-current converter that receives an input voltage signal to be modulated, a reference voltage signal, and a control voltage signal, and generates an output current signal by combining the input voltage signal and the control voltage signal. The input voltage signal is amplified by a transconductance amplifier. The control voltage signal is converted into a gain signal which is used to vary the transconductance of the amplifier. A voltage controlled oscillator generates a frequency modulated signal responsive to the output current signal. The center frequency and modulation factor can be controlled by adjusting the value of a resistor in the current-to-voltage converter, a capacitor in the voltage control oscillator, or the control voltage signal.

One aspect of the present invention is a frequency modulator comprising: a converter that generates an output signal responsive to an input signal and a control signal, the converter controlling a center frequency and modulating degree responsive to the control signal; and an oscillator coupled to the converter, the oscillator generating a frequency modulation signal responsive to the output signal from the converter.

The converter includes: a first voltage-to-current converter for generating a gain signal responsive to the control signal; and an amplifier coupled to the first voltage-to-current converter for amplifying the input signal responsive to the gain signal.

Another aspect of the present invention is a method for controlling center frequency and modulation degree with a control signal while generating a frequency modulated signal, the method comprising: combining the control signal with an input signal thereby generating an output signal; and generating a frequency modulated signal responsive to the output signal. Combining the control signal with input signal includes: generating a gain signal responsive to the control signal; and amplifying the input signal responsive to the gain signal. Amplifying the input signal includes: amplifying the input signal with a transconductance amplifier; and controlling the transconductance of the amplifier with the gain signal. Generating the gain signal responsive to the control signal includes: coupling the control signal to a resistor thereby generating the gain signal; and controlling the gain signal by adjusting the resistance value of the resistor.

An advantage of the present invention is that it eliminates the need for external resistors for adjusting the center frequency and the modulation factor.

The foregoing and other objects, features and advantages of the invention will become more readily apparent from the following detailed description of a preferred embodiment of the invention which proceeds with reference to the accompanying drawings.

DETAILED DESCRIPTION OF THE PREFERRED EMBODIMENT

Figure 1:
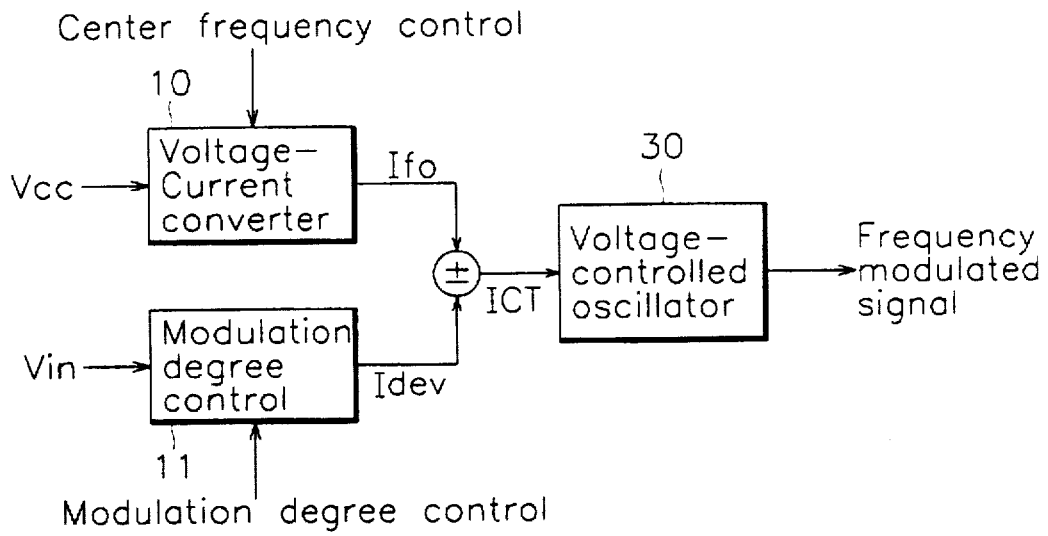
FIG. 1 is a block diagram of a prior art frequency modulator.
Figure 2:
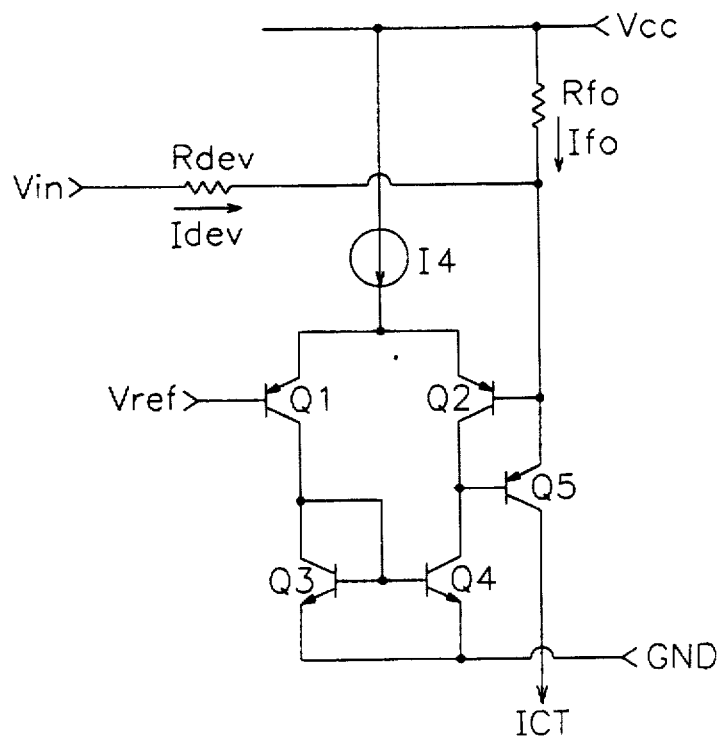
FIG. 2 is a schematic diagram of an implementation of the prior art frequency modulator of FIG. 1.
Figure 3:
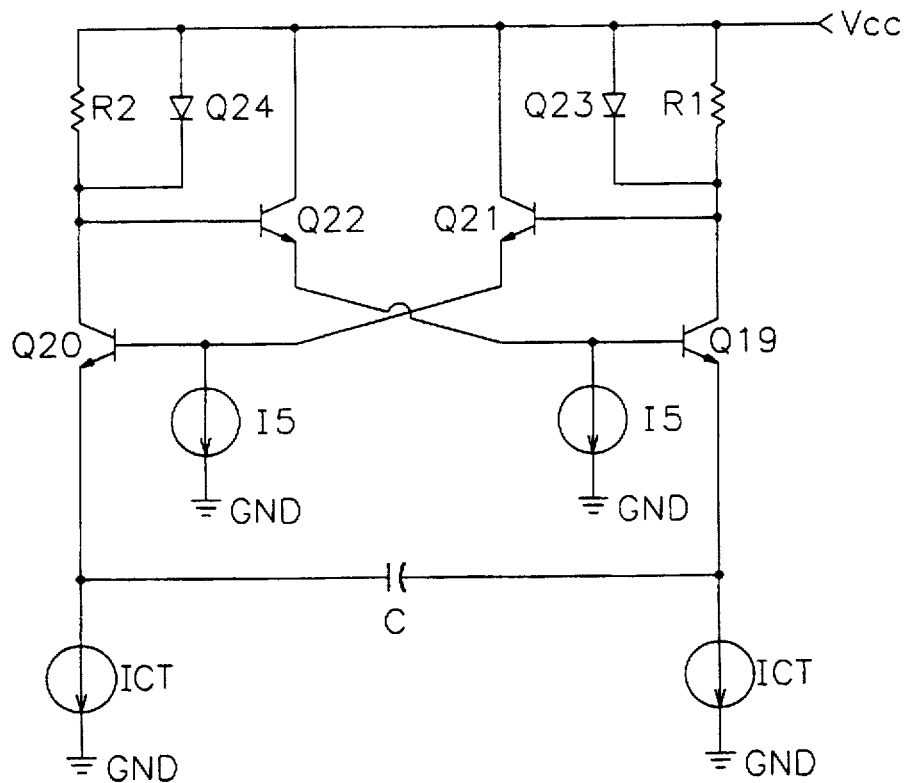
FIG. 3 is a schematic diagram of a prior art voltage controlled oscillator.
Figure 4:
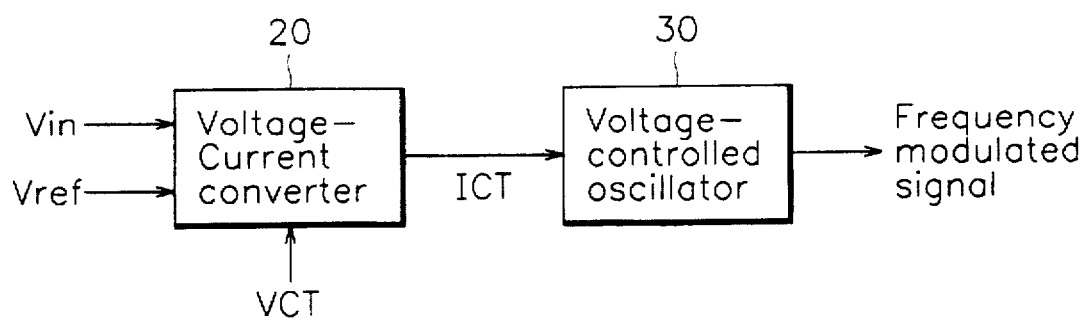
FIG. 4 is a block diagram of an embodiment of a frequency modulator in accordance with the present invention.

An embodiment of a frequency modulator in accordance with the present invention is shown in FIG. 4. Prior to describing the detailed structure and operation of the frequency modulator of FIG. 4. the key components of the invention will be identified followed by a brief description of the operation of the system. Then, a more detailed description of each of the components will be provided along with a more detailed description of the operation.

Referring to FIG. 4, a frequency modulator according to the preset invention includes a voltage-to-current converter 20 which receives an input voltage signal Vin, a reference voltage signal Vref and a control voltage signal $V_{CT}$ for adjusting the center frequency and modulation degree. The converter 20 generates an output current signal $I_{CT}$ capable of adjusting the center frequency and the modulation degree at the same time responsive to the control voltage signal $V_{CT}$. The frequency modulator also includes a voltage controlled oscillator 30 which receives the output current signal $I_{CT}$ from the voltage-to-current converter 20 and generates a frequency modulated signal.

Figure 5:
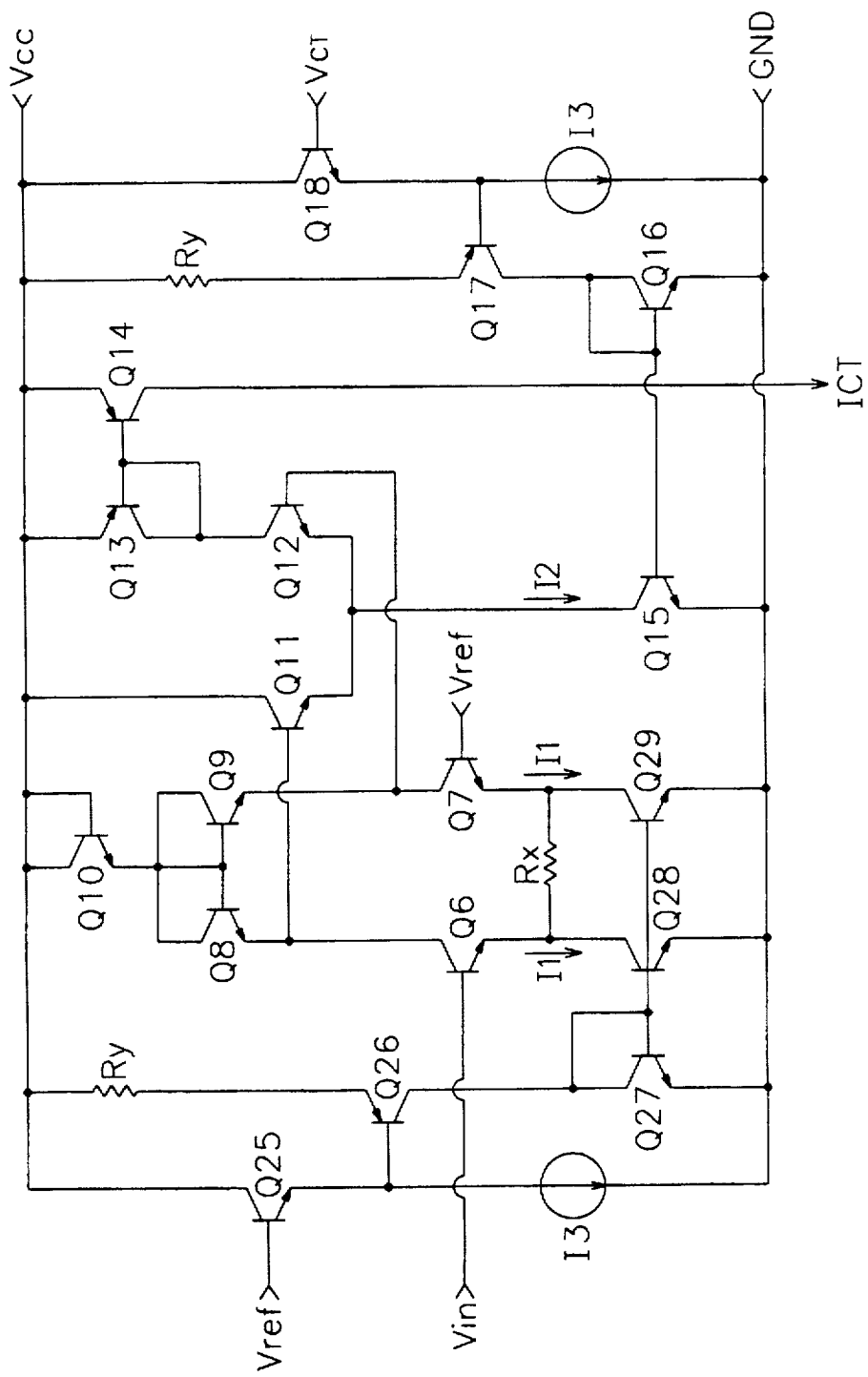
FIG. 5 is a schematic diagram of an embodiment of the voltage-to-current converter of FIG. 4.

More detailed consideration will now be given to the structure of a frequency modulator according to the present invention. FIG. 5 is a schematic diagram of an embodiment of the voltage-to-current converter 20 of FIG. 4. Referring to FIG. 5, the voltage-to-current converter 20 includes a first voltage-to-current converter which includes an NPN transistor Q18 having a collector coupled to a first power supply node Vcc, a base coupled to a control node for receiving the control voltage signal $V_{CT}$, and an emitter coupled to a second power supply node GND through a current source I3. The first voltage-to-current converter also includes a PNP transistor Q17 having an emitter coupled to $V_{CC}$ through a first resistor Ry, and a base coupled to the emitter of Q18.

A first current mirror couples the output from the first voltage-to-current converter to an amplifier and includes a pair of NPN transistors Q15 and Q16 having their emitters coupled to GND, and their bases coupled together. The collector of Q16 is coupled back to its base and to the collector of Q17. The collector Q15 forms a gain control node.

The voltage-to-current converter 20 also includes a two-stage an amplifier. The first stage includes a pair of NPN transistors Q6 and Q7 and a resistor Rx having a first terminal coupled to the emitter of Q6 and second terminal coupled to the emitter of Q7. The base of Q6 is coupled to an input node to receive the input voltage signal Vin, and the base of Q7 is coupled to a reference node to receive the reference voltage signal Vref.

The second stage of the amplifier includes two NPN transistors Q11 and Q12 having their emitters coupled together at the gain control node. The base of Q11 is coupled to the collector of Q6 and the base of Q12 is coupled to the collector of Q7. The collector of Q11 is coupled to $V_{CC}$, while the collector of Q12 is coupled to a third current mirror.

The voltage-to-current converter 20 includes a second voltage-to-current converter which includes an NPN transistor Q25 having a collector coupled to $V_{CC}$, an emitter coupled to GND through a second current source I3, and a base coupled to the reference node. The second voltage-to-current converter also includes a PNP transistor having an emitter coupled to $V_{CC}$ through a third resistor Ry, and a base coupled to the emitter of Q25.

A second current mirror couples the output from the second voltage-to-current converter to the first stage of the amplifier and includes three NPN transistors Q27, Q28 and Q29 having their emitters coupled to GND, and their bases coupled together. The collector of Q27 is coupled back to its base and to the collector of Q26. The collector of Q28 is coupled to the emitter of Q6 and the collector of Q29 is coupled to the emitter of Q7.

A load circuit for the first amplifier stage includes three NPN transistors Q8, Q9 and Q10. The base and collector of Q10 are coupled together and to $V_{CC}$. The emitter of Q8 is coupled to the collector of Q6 and the emitter of Q9 is coupled to the collector of Q7. The bases of Q8 and Q9 are coupled together and to the emitter of Q10, and the collectors of Q8 and Q9 are also coupled together and to the emitter of Q10.

The third current mirror couples the output from the second amplifier stage to the voltage controlled oscillator through an output node. The third current mirror includes a pair of PNP transistors Q13 and Q14 having their emitters coupled to $V_{CC}$, and their bases coupled together. The collector of Q13 is coupled back to its base and to the collector of Q12. The collector of Q14 forms the output node.

More detailed consideration will now be given to the operation of the present invention. The first voltage-to-current converter generates a gain control signal $I_2$ in response to the control voltage signal $V_{CT}$ which is coupled to the second stage of the amplifier by the first current mirror via the gain control node. The first resistor Ry controls the level of $I_2$. The second voltage-to-current converter generates a bias current signal $I_1$ which is coupled to the first stage of the amplifier by the second current mirror. The third resistor Ry controls the level of $I_1$.

The input voltage signal Vin is amplified by the first stage of the amplifier which generates an intermediate differential signal which is then amplified by the second stage to generate the output current signal $I_{CT}$. The transconductance of the amplifier is controlled by the gain signal I2. The output current signal is coupled to the output node by the third current mirror. The voltage controlled oscillator 30 then generates a frequency modulated signal in response to the output current signal.

The relation between the center frequency fo and the control voltage $V_{CT}$ of the voltage-current converter is derived as follows:

$$gm = \frac{I_2}{2 \times R_x \times I_1} \qquad \text{(Eq. 3)}$$

$$I_2 = \frac{V_{CC} - V_{CT}}{Ry} \qquad \text{(Eq. 4)}$$

$$I_1 = \frac{V_{CC} - V_{ref}}{Ry} \qquad \text{(Eq. 5)}$$

$$fo = \frac{I_{CT}}{4 \times C \times Vbe(\text{on})} = \frac{(1/2) \times I_2 \pm gm \times Vin}{4 \times C \times Vbe(\text{on})} = \qquad \text{(Eq. 6)}$$

$$\frac{(V_{CC} - V_{CT})/(2Ry) \pm [(V_{CC} - V_{CT})Vin]/[2R_x \times (V_{CC} - V_{ref})]}{4 \times C \times Vbe(\text{on})}$$

where gm is an overall transconductance, $I_1$ is the collector current of transistors Q28 and Q29, $I_2$ is the collector current of transistor Q15, $R_x$ is the value of the resistor connected between emitters of Q6 and Q7, and Ry is the value of the resistor that connect the emitters of the transistors Q26 and Q17 to the power supply node $V_{CC}$.

From this, if $Vx = V_{CC} - V_{CT}$, $Va = V_{CC} - Vref$ and $k = Ry/Rx$, $$fo = \frac{1 \pm (Ry/R_x) \times (1/Va) \times Vin}{8 \times Ry \times C \times Vbe(\text{on})} \times Vx = \qquad \text{(Eq. 7)}$$

$$\frac{1 \pm (k/Va) \times Vin}{8 \times Ry \times C \times Vbe(\text{on})} \times Vx$$

As described in Eq. 7, the center frequency and the modulation magnitude are controlled by the value of the resistors Ry and capacitor C, as well as by adjustment of the control voltage signal $V_{CT}$. Thus, the center frequency and degree of modulation can be controlled at the same time by one control terminal. This eliminates the resistors $R_{fc}$ and $R_{dev}$ which are external component in prior art frequency modulators.

Having described and illustrated the principles of the invention in a preferred embodiment thereof, it should be apparent that the invention can be modified in arrangement and detail without departing from such principles. I claim all modifications and variations coming within the spirit and scope of the following claims.

I claim:

1. A frequency modulator comprising:
   a converter that generates an output signal responsive to an input signal and a control signal, wherein the control signal controls the output signal so as to control a center frequency and a modulating degree of a frequency modulation signal; and
   an oscillator coupled to the converter, the oscillator generating the frequency modulation signal responsive to the output signal from the converter;
   wherein the converter includes:
   a first voltage-to-current converter for generating a gain signal responsive to the control signal; and
   an amplifier coupled to the first voltage-to-current converter for amplifying the input signal at a gain determined by the gain signal.

2. A frequency modulator comprising:
   a converter that generates an output signal responsive to an input signal and a control signal, wherein the control signal controls the output signal so as to control a center frequency and a modulating degree of a frequency modulation signal; and
   an oscillator coupled to the converter, the oscillator generating the frequency modulation signal responsive to the output signal from the converter;
   wherein the converter includes:
   a first voltage-to-current converter for generating a gain signal responsive to the control signal; and
   an amplifier coupled to the first voltage-to-current converter for amplifying the input signal responsive to the gain signal;
   wherein the amplifier includes:
   a first amplifier stage for generating an intermediate signal responsive to the input signal; and
   a second amplifier stage for generating the output signal responsive to the intermediate signal and the gain signal.

3. A frequency modulator according to claim 2 further including a second voltage-to-current converter coupled to the amplifier for generating a bias current signal responsive to a reference signal.

4. A frequency modulator according to claim 3 further including:
   a first current mirror for coupling the first voltage-to-current converter to the amplifier; and
   a second current mirror for coupling the second voltage-to-current converter to the amplifier.

5. A frequency modulator according to claim 4 further including:
   a third current mirror for coupling the amplifier to the oscillator; and
   a load for loading the first amplifier stage.

6. A frequency modulator according to claim 4 wherein the first voltage-to-current converter includes:
   a first transistor having a collector coupled to a first power supply node, a base coupled to a control node, and an emitter coupled to a second power supply node through a first current source; and
   a second transistor having an emitter coupled to the first power supply node through a first resistor, a base coupled to the emitter of the first transistor, and a collector.

7. A frequency modulator according to claim 6 wherein the first current mirror includes:
   a third transistor having an emitter coupled to the second power supply node, a collector coupled to the collector of the second transistor, and a base coupled to the collector of the third transistor; and
   a fourth transistor having an emitter coupled to the second power supply node, a base coupled to the base of the third transistor, and a collector coupled to a gain control node.

8. A frequency modulator according to claim 5 wherein the first amplifier stage includes:
   a first resistor having a first and second terminal;
   a first transistor having an emitter coupled to the first terminal of the first resistor, a base coupled to an input node, and a collector; and
   a second transistor having an emitter coupled to the second terminal of the first resistor, a base coupled to a reference node, and a collector.

9. A frequency modulator according to claim 8 wherein the second amplifier stage includes:
   a third transistor having an emitter coupled to a gain control node, a collector coupled to a first power supply node, and a base coupled to the collector of the first transistor; and
   an fourth transistor having an emitter coupled to the gain control node, a base coupled to the collector of the second transistor, and a collector.

10. A frequency modulator according to claim 9 wherein the second voltage-to-current converter includes:
  a fifth transistor having a collector coupled to the first power supply node, an emitter coupled to a second power supply node through a second current source, and a base coupled to the reference node; and
  a sixth transistor having an emitter coupled to the first power supply node through a second resistor, a base coupled to the emitter of the fifth transistor, and a collector.

11. A frequency modulator according to claim 10 wherein the second current mirror includes:
  an seventh transistor having an emitter coupled to the second power supply node, a collector coupled to the collector of the sixth transistor, and a base coupled to the collector of the seventh transistor;
  a eighth transistor having an emitter coupled to the second power supply node, a collector coupled to the first terminal of the first resistor, and a base coupled to the base of the seventh transistor; and
  a ninth transistor having an emitter coupled to the second power supply node, a collector coupled to the second terminal of the first resistor, and a base coupled to the base of the seventh transistor.

12. A frequency modulator according to claim 8 wherein the load includes:
  a third transistor having a collector coupled to a first power supply node, a base coupled to the first power supply node, and a collector;
  a fourth transistor having an emitter coupled to the collector of the first transistor, a base coupled to the emitter of the third transistor, and a collector coupled to the emitter of the third transistor; and
  a fifth transistor having an emitter coupled to the collector of the second transistor, a base coupled to the emitter of the third transistor, and a collector coupled to the emitter of the third transistor.

13. A frequency modulator according to claim 9 wherein the third current mirror includes:
  a fifth transistor having an emitter coupled to the first power supply node, a collector coupled to the collector of the fourth transistor, and a base coupled to the collector of the fourth transistor; and
  an sixth transistor having an emitter coupled to the first power supply node, a collector coupled to an output node, and a base coupled to the base of the fifth transistor.

14. A frequency modulator comprising:
  a converter that generates an output signal responsive to an input signal and a control signal, wherein the control signal controls the output signal so as to control a center frequency and a modulating degree of a frequency modulation signal; and
  an oscillator coupled to the converter, the oscillator generating the frequency modulation signal responsive to the output signal from the converter;
  wherein the converter includes:
  a first transistor having a collector coupled to a first power supply node, a base coupled to a control node, and an emitter coupled to a second power supply node through a first current source;
  a second transistor having an emitter coupled to the first power supply terminal through a first resistor, a base coupled to the emitter of the first transistor, and a collector;
  a third transistor having an emitter coupled to the second power supply node, a collector coupled to the collector of the second transistor, and a base coupled to the collector of the third transistor;
  a fourth transistor having an emitter coupled to the second power supply node, a base coupled to the base of the third transistor, and a collector coupled to a gain control node;
  a second resistor having a first and second terminal;
  a fifth transistor having an emitter coupled to the first terminal of the second resistor, a base coupled to an input node, and a collector; a sixth transistor having an emitter coupled to the second terminal of the second resistor, a base coupled to a reference node, and a collector;
  a seventh transistor having an emitter coupled to the gain control node, a collector coupled to the first power supply node, and a base coupled to the collectors of the fifth transistor;
  an eighth transistor having an emitter coupled to the gain control node, a base coupled to the collector of the sixth transistor, and a collector;
  a ninth transistor having a collector coupled to the first power supply node, an emitter coupled to the second power supply node through a second current source, and a base coupled to the reference node;
  a tenth transistor having an emitter coupled to the first power supply node through a third resistor, a base coupled to the emitter of the ninth transistor, and a collector;
  an eleventh transistor having an emitter coupled to the second power supply node, a collector coupled to the collector of the tenth transistor, and a base coupled to the collector of the eleventh transistor;
  a twelfth transistor having an emitter coupled to the second power supply node, a collector coupled to the first terminal of the second resistor, and a base coupled to the base of the eleventh transistor;
  a thirteenth transistor having an emitter coupled to the second power supply node, a collector coupled to the second terminal of the second resistor, and a base coupled to the base of the eleventh transistor;
  a fourteenth transistor having a collector coupled to the first power supply node, a base coupled to the first power supply node, and a collector;
  a fifteenth transistor having an emitter coupled to the collector of the fifth transistor, a base coupled to the emitter of the fourteenth transistor, and a collector coupled to the emitter of the fourteenth transistor;
  a sixteenth transistor having an emitter coupled to the collector of the sixth transistor, a base coupled to the emitter of the fourteenth transistor, and a collector coupled to the emitter of the fourteenth transistor;
  a seventeenth transistor having an emitter coupled to the first power supply node, a collector coupled to the collector of the eighth transistor, and a base coupled to the collector of the eighth transistor; and
  an eighteenth transistor having an emitter coupled to the first power supply node, a collector coupled to an output node, and a base coupled to the base of the seventeenth transistor.

15. A frequency modulator comprising:
  means for generating an output signal responsive to an input signal and a control signal, wherein a center frequency and modulation degree are controlled responsive to the control signal; and means for generating a frequency modulated signal responsive to the output signal;

wherein the means for generating an output signal includes:

a first voltage-to-current converter for generating gain signal responsive to the control signal, and an amplifier coupled to the first voltage-to-current converter for amplifying the input signal at a gain determined by the gain signal.

16. A method for generating a frequency modulated signal, the method comprising:

amplifying an input signal at a gain determined by a gain signal, thereby generating an output signal;

generating the frequency modulated signal responsive to the output signal; and generating the gain signal responsive to a control signal such that the center frequency and modulation degree of the frequency modulated signal are controlled by the control signal.

17. A method according to claim 16 wherein amplifying the input signal includes:

amplifying the input signal with a transconductance amplifier; and controlling the transconductance of the amplifier with the gain signal.

18. A method according to claim 16 wherein generating the gain signal responsive to the control signal includes:

coupling the control signal to a resistor so that the magnitude of the gain signal is determined by the magnitude of the control signal and the value of the resistor.

* * * * *